US008975983B2

(12) United States Patent
Masuda

(10) Patent No.: US 8,975,983 B2
(45) Date of Patent: Mar. 10, 2015

(54) BAND-PASS FILTER

(71) Applicant: Murata Manufacturing Co., Ltd., Nagaokakyo-shi, Kyoto-fu (JP)

(72) Inventor: Yutaka Masuda, Nagaokakyo (JP)

(73) Assignee: Murata Manufacturing Co, Ltd., Kyoto (JP)

( * ) Notice: Subject to any disclaimer, the term of this patent is extended or adjusted under 35 U.S.C. 154(b) by 226 days.

(21) Appl. No.: 13/705,588

(22) Filed: Dec. 5, 2012

(65) Prior Publication Data

US 2013/0154769 A1 Jun. 20, 2013

(30) Foreign Application Priority Data

Dec. 19, 2011 (JP) .................................. 2011-277334

(51) Int. Cl.
*H03H 7/01* (2006.01)
*H01P 7/08* (2006.01)
*H01P 1/203* (2006.01)
*H03H 1/00* (2006.01)

(52) U.S. Cl.
CPC .......... *H01P 7/08* (2013.01); *H03H 2001/0085* (2013.01); *H03H 7/0161* (2013.01); *H01P 1/20345* (2013.01)
USPC ......................................... 333/185; 333/175

(58) Field of Classification Search
CPC ................... H03H 2001/0085; H03H 7/0161; H01P 1/20345; H01P 7/08
USPC .................................................. 333/175, 185
See application file for complete search history.

(56) References Cited

U.S. PATENT DOCUMENTS 7,443,268 B2 * 10/2008 Tsai et al. ..................... 333/175

FOREIGN PATENT DOCUMENTS

| JP | 03-274814 A | 12/1991 |
|---|---|---|
| JP | 2002-76807 A | 3/2002 |
| JP | 2007-123993 A | 5/2007 |
| JP | 2008-017242 A | 1/2008 |
| JP | 2008-294603 A | 12/2008 |
| WO | 2007/119356 A1 | 10/2007 |

OTHER PUBLICATIONS

Official Communication issued in corresponding Japanese Patent Application No. 2011-277334, mailed on Nov. 5, 2013.

* cited by examiner

*Primary Examiner* — Benny Lee
*Assistant Examiner* — Rakesh Patel
(74) *Attorney, Agent, or Firm* — Keating & Bennett, LLP

(57) ABSTRACT

A capacitor of a certain LC resonator, among multiple LC resonators in a band-pass filter, is arranged at a side of one main surface in a stacking direction of a multilayer body of the band-pass filter and the capacitors of the remaining LC resonators are arranged at a side of the other main surface in the stacking direction of the multilayer body. One of a pair of capacitor electrodes of the capacitor of the certain LC resonator is grounded. The one capacitor electrode that is grounded covers at least the plurality of LC resonators, as viewed from the stacking direction of the multilayer body.

5 Claims, 14 Drawing Sheets

FREQUENCY (MHz)

FREQUENCY (MHz)

FREQUENCY (MHz)

BAND-PASS FILTER

BACKGROUND OF THE INVENTION

1. Field of the Invention

The present invention relates to a multilayer band-pass filter.

2. Description of the Related Art

High-frequency band-pass filters appropriate for size reduction and low profile have been configured by providing multiple LC resonators in multilayer bodies in which dielectric layers are stacked. FIG. 12 shows an example of the structure of a typical band-pass filter in the related art.

Referring to FIG. 12, a band-pass filter 1 includes multiple dielectric layers R2 to R9 and three LC resonators Q10, Q20, and Q30.

Resonator capacitor electrodes 16a, 16b, 17a, 17b, 18a, and 18b, adjacent coupling capacitor electrode R13 to R15, 19, and 20, a jump-coupling capacitor electrode 21, ground-side capacitor electrodes 31 to 33, a ground electrode 25, line electrodes 26 to 28, inductor via electrodes 10a to 10d, 11a to 11d, and 12a to 12d that penetrate through the dielectric layers, and connection via electrodes 41a, 41b, 42a, 42b, 43a, and 43b are appropriately provided on or in the dielectric layers R2 to R9.

The LC resonator Q10 includes the resonator capacitor electrodes 16a and 16b, the ground-side capacitor electrode 31, the ground electrode 25, the line electrode 26, the inductor via electrodes 10a to 10d, and the connection via electrodes 41a and 41b.

The LC resonator Q20 includes the resonator capacitor electrodes 17a and 17b, the ground-side capacitor electrode 32, the ground electrode 25, the line electrode 27, the inductor via electrodes 11a to 11d, and the connection via electrodes 42a and 42b.

The LC resonator Q30 includes the resonator capacitor electrodes 18a and 18b, the ground-side capacitor electrode 33, the ground electrode 25, the line electrode 28, the inductor via electrodes 12a to 12d, and the connection via electrodes 43a and 43b.

The structure of the LC resonator Q10, which is representative of the LC resonators Q10 to Q30, will now be described in detail.

The inductor via electrodes 10a to 10d are connected to each other to define a columnar inductor L10. The columnar inductor L10 is connected to the line electrode to define the resonator inductor L10. The resonator capacitor electrodes 16a and 16b are electrically connected to each other via the connection via electrodes 41a and 41b. The resonator capacitor electrodes 16a and 16b oppose the ground electrode 25 and the ground-side capacitor electrode 31 to define a resonator capacitor C10 between the resonator capacitor electrodes 16a and 16b, the ground electrode 25, and the ground-side capacitor electrode 31. The resonator capacitor electrodes 16a and 16b are connected to the inductor via electrode 10a, which is an end of the inductor L10, and the resonator inductor L10 and the resonator capacitor C10 define the LC resonator Q10. The LC resonators Q20 and Q30 have structures similar to that of the LC resonator Q10.

The adjacent coupling capacitor electrodes R13, R14, and R15 form a capacitance with the adjacent coupling capacitor electrodes 19 and 20 to define adjacent coupling capacitors Cs10 and Cs20 for coupling between the adjacent LC resonators. The adjacent coupling capacitor electrodes R13 and R15 and the jump-coupling capacitor electrode 21 opposing the adjacent coupling capacitor electrodes R13 and R15 form a capacitance to define a coupling capacitor Cs30 for the jump-coupling between the LC resonator Q10 and the LC resonator Q30.

Since the three LC resonators defining the band-pass filter are covered with the ground electrode 25, which is disposed substantially over the dielectric layer on one main surface in the stacking direction of the multilayer body, in the band-pass filter having the above structure, it is possible to reduce noise from an external electronic component, thereby achieving excellent frequency characteristics.

For example, refer to Japanese Unexamined Patent Application Publication No. 2002-76807.

In the band-pass filter 1 described above, the ground electrode 25 disposed on the upper surface of the filter allows the external noise to be blocked to achieve the excellent frequency characteristics. However, further promotion of the size reduction and the low profile of the band-pass filter 1 decreases the thickness of the dielectric layers which decreases the distance between the ground electrode 25 and the LC resonators Q10 to Q30 defining the band-pass filter 1. This causes a problem in that unintended electromagnetic field coupling occurs between the resonator capacitor electrodes 16a, 17a, and 18a via the ground electrode 25 to prevent desired frequency characteristics from being achieved.

SUMMARY OF THE INVENTION

To overcome the problems described above, preferred embodiments of the present invention provide a compact band-pass filter that blocks external noise and achieves desired frequency characteristics without causing unintended electromagnetic field coupling between the electrodes provided in the band-pass filter.

According to a preferred embodiment of the present invention, a band-pass filter includes a multilayer body including a plurality of dielectric layers that are stacked, capacitor electrodes provided on the dielectric layers, line electrodes provided on the dielectric layers, and a via inductor defined by a plurality of via electrodes that are connected to each other and that penetrate through the dielectric layers. A plurality of LC resonators is arranged in a direction perpendicular or substantially perpendicular to a stacking direction of the multilayer body. An inductor including the via inductor is connected to a capacitor that includes a pair of the capacitor electrodes in each of the plurality of LC resonators. In each of the plurality of LC resonators, one end of the inductors is connected to one of the paired capacitor electrodes in the capacitor. The capacitor of at least one certain LC resonator, among the plurality of LC resonators, is arranged at the side of one main surface in the stacking direction of the multilayer body and the capacitors of the remaining LC resonators are arranged at the side of the other main surface in the stacking direction of the multilayer body. The other of the paired capacitor electrodes of the capacitor of the certain LC resonator is grounded. With this configuration, since the distance between the line electrodes of the LC resonators is relatively long, unnecessary electromagnetic field coupling caused via an electrode, such as a shield electrode against an external component or a ground electrode, can be prevented or minimized to achieve desired characteristics.

The other capacitor electrode that is grounded is preferably configured so as to cover at least the plurality of LC resonators, when viewed from the stacking direction of the multilayer body. In this case, it is possible to provide a compact band-pass filter capable of reducing external noise and preventing or minimizing the unnecessary electromagnetic field coupling.

The band-pass filter preferably includes the LC resonator including an input terminal and the LC resonator including an output terminal, and the LC resonator next to the LC resonator including the input terminal is preferably the certain LC resonator. In this case, it is possible to provide a band-pass filter having excellent out-of-band attenuation characteristics.

The inductor of each of the plurality of LC resonators preferably includes the line electrode and a pair of via inductors, and one end of one of the pair of via inductors and one end of the other of the pair of via inductors are preferably connected to one end and the other end of the line electrode to form a loop inductor. In this case, it is possible to provide a band-pass filter having a high inductance.

The inductor of at least one LC resonator in the certain LC resonator preferably includes the via inductor. In this case, since unnecessary coupling between the line electrode and the ground electrode is decreased, it is possible to provide a band-pass filter having more desirable frequency characteristics.

It is preferable in each of the LC resonator including the input terminal and the LC resonator including the output terminal include the line electrode, that both ends of the line electrode be electrically connected to the via inductor to define a loop inductor, that a coupling electrode be arranged so as to oppose the line electrodes, and that the coupling electrode be arranged so as to be connected to the inductor of the LC resonator adjacent to at least one of the LC resonator including the input terminal and the LC resonator including the output terminal or it is preferable that the coupling electrode be arranged so as to oppose the line electrode of the LC resonator including the input terminal and the line electrode of the LC resonator including the output terminal. In this case, since the capacitance can be increased without increasing the size of the band-pass filter, it is possible to provide a band-pass filter having excellent characteristics.

As apparent from the above description, according to various preferred embodiments of the present invention, it is possible to provide a compact band-pass filter that is capable of preventing or minimizing the unnecessary electromagnetic field coupling between the LC resonators by varying the arrangement of the LC resonators and that is less affected by external noise while the characteristics when no shield is provided are maintained by using the capacitor electrode also as a shield.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will herein be described with reference to the attached drawings.

First Preferred Embodiment

Figure 1:
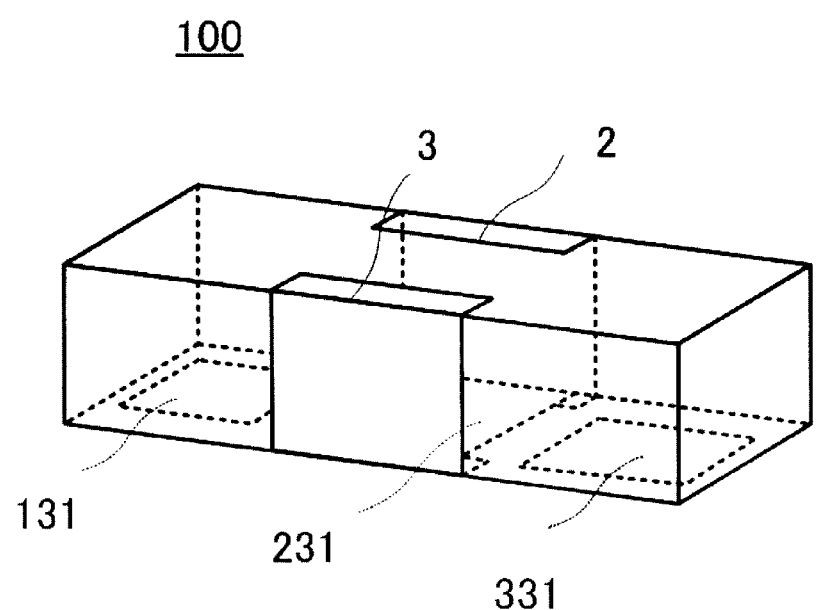
FIG. 1 is an external perspective view of a band-pass filter according to a first preferred embodiment of the present invention.
Figure 2:
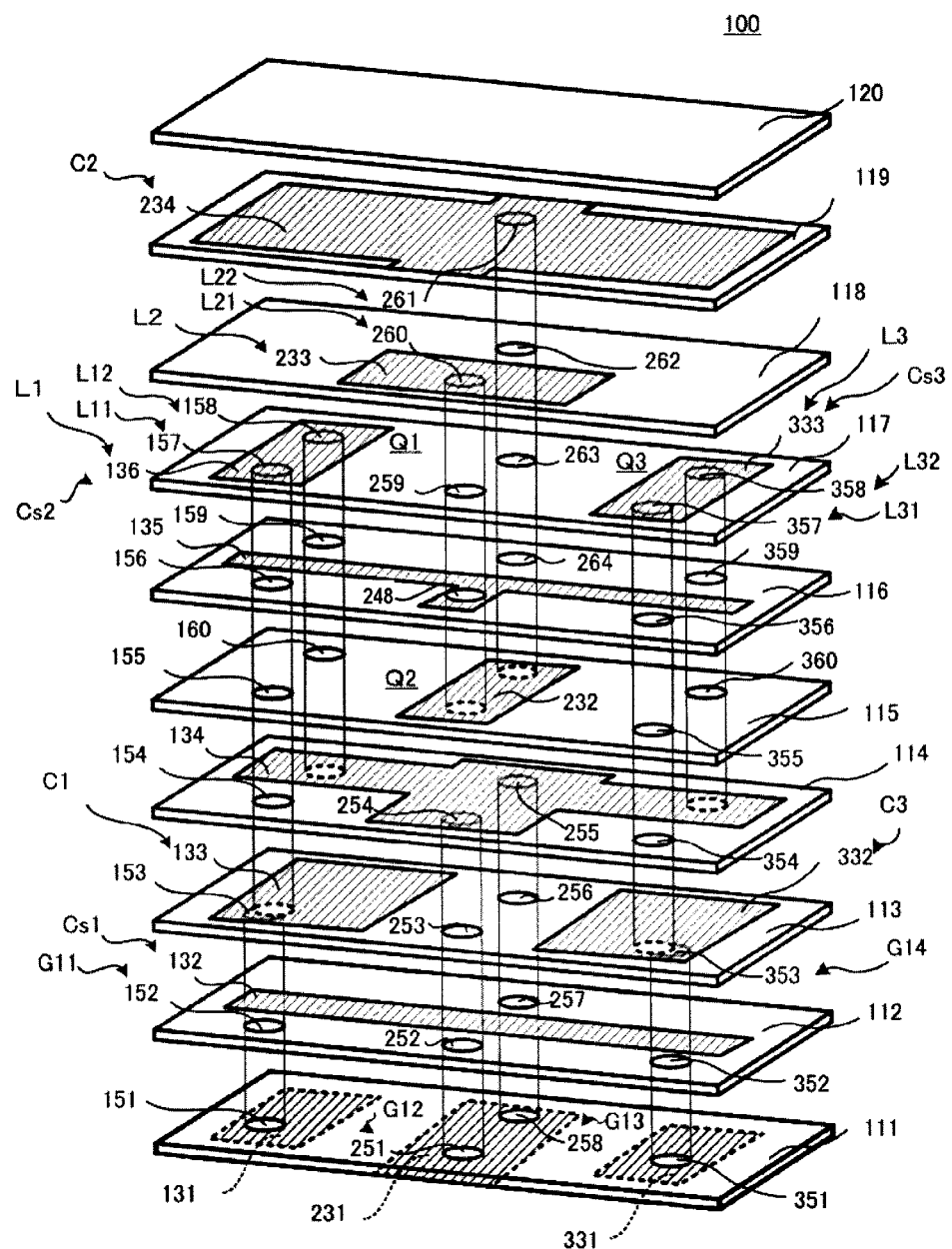
FIG. 2 is an exploded perspective view of the band-pass filter according to the first preferred embodiment of the present invention.
Figure 3:
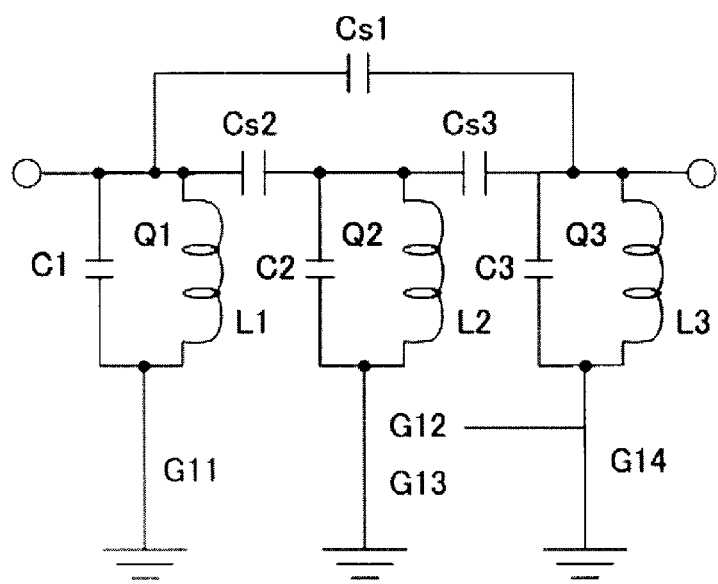
FIG. 3 is an electrical equivalent circuit diagram of the band-pass filter according to the first preferred embodiment of the present invention.

A band-pass filter according to a first preferred embodiment of the present invention will now be described with reference to FIGS. 1 to 3. FIG. 1 is an external perspective view of the band-pass filter according to the first preferred embodiment. FIG. 2 is an exploded perspective view of the band-pass filter according to the first preferred embodiment, in which ground terminals 2 and 3 are omitted. FIG. 3 is an equivalent circuit diagram of the band-pass filter according to the first preferred embodiment.

Referring to FIG. 2, a band-pass filter 100 according to the first preferred embodiment preferably includes a multilayer body in which multiple dielectric layers are stacked. Via electrodes that penetrate through certain electrodes and dielectric layers described below in the stacking direction are provided in the dielectric layers.

The band-pass filter 100 preferably includes three LC resonators, for example. A first-stage LC resonator Q1 includes an input electrode and a third-stage LC resonator Q3 includes an output electrode. Each dielectric layer will now be described in detail.

A dielectric layer 111 includes connection via electrodes 151, 251, 258, and 351 provided therein. An input electrode 131, an output electrode 331, and a ground electrode 231 of the band-pass filter 100 are provided on the rear surface of the dielectric layer 111.

A dielectric layer 112 includes a jump-coupling capacitor electrode 132 for capacitive coupling between the first-stage and third-stage LC resonators Q1 and Q3 provided thereon. The dielectric layer 112 also includes connection via electrodes 152, 252, 257, and 352 provided therein.

A dielectric layer 113 includes capacitor electrodes 133 and 332 provided thereon. The dielectric layer 113 also includes connection via electrodes 153, 253, 256, and 353 provided therein.

A dielectric layer 114 includes a capacitor electrode 134 provided thereon. The dielectric layer 114 also includes inductor via electrodes 154 and 354 and connection via electrodes 254 and 255 provided therein.

A dielectric layer 115 includes a line electrode 232 of a second-stage LC resonator Q2 provided thereon. The dielectric layer 115 also includes inductor via electrodes 155, 160, 355, and 360 provided therein.

A dielectric layer 116 includes an adjacent coupling capacitor electrode 135 provided thereon. The dielectric layer 116 also includes inductor via electrodes 156, 159, 248, 264, 356, and 359 provided therein. The adjacent coupling capacitor electrode 135 includes an extension conducting to the inductor via electrode 248.

A dielectric layer 117 includes line electrodes 136 and 333 of the first-stage and third-stage LC resonators Q1 and Q3 provided thereon. The dielectric layer 117 also includes inductor via electrodes 157, 158, 259, 263, 357, and 358 provided therein.

A dielectric layer 118 includes a resonator capacitor electrode 233 of the second-stage LC resonator Q2 provided thereon. The dielectric layer 118 also includes inductor via electrodes 260 and 262 provided therein.

A dielectric layer 119 includes a ground-side capacitor electrode 234 provided thereon. The ground-side capacitor electrode 234 extends substantially over the surface of the dielectric layer 119. The ground-side capacitor electrode 234 includes extensions extending to both long side edges of the dielectric layer 119. The dielectric layer 119 also includes a via electrode 261 provided therein. The via electrode 261 penetrates through the dielectric layer 119 in the stacking direction.

A dielectric layer 120 is an outermost layer and includes no electrode provided thereon or therein.

The structure of the first-stage LC resonator Q1 will now be described.

A resonator capacitor C1 includes the resonator capacitor electrode 133 and the ground-side capacitor electrode 134 that opposes the capacitor electrode 133. The ground-side capacitor electrode 134 is grounded. The inductor via electrodes 154 to 157 are connected to each other to define a columnar inductor L11, and the inductor via electrodes 158 to 160 are connected to each other to compose a columnar inductor L12. The inductor via electrode 157, which is at one end of the columnar inductor L11, and the inductor via electrode 158, which is at one end of the columnar inductor L12, are connected to both ends of the line electrode 136 to define a loop resonator inductor L1.

The inductor via electrode 154, which is at the other end of the columnar inductor L11, is connected to the resonator capacitor electrode 133 of the resonator capacitor C1 and the inductor via electrode 160, which is at the other end of the columnar inductor L12, is connected to the ground-side capacitor electrode 134 of the resonator capacitor C1 to define the first-stage LC resonator Q1. The connection via electrodes 151 and 152 are connected to each other to define a columnar input electrode G11. The connection via electrode 153, which at one end of the columnar input electrode G11, is connected to the resonator capacitor electrode 133 and the connection via electrode 151, which is at the other end of the columnar input electrode G11, is connected to the input electrode 131.

The structure of the second-stage LC resonator Q2 will now be described.

A resonator capacitor C2 includes the resonator capacitor electrode 233 and the ground-side capacitor electrode 234 that opposes the resonator capacitor electrode 233. The inductor via electrodes 248, 259, and 260 are connected to each other to define a columnar inductor L21, and the inductor via electrodes 261 to 264 are connected to each other to define a columnar inductor L22. The inductor via electrode 248, which is at one end of the columnar inductor L21, and the inductor via electrode 264, which is at one end of the columnar inductor L22, are connected to both ends of the line electrode 232 to define a loop resonator inductor L2. The inductor via electrode 260, which is at the other end of the columnar inductor L21, is connected to the resonator capacitor electrode 233 of the resonator capacitor C2 and the inductor via electrode 261, which is at the other end of the columnar inductor L22, is connected to the ground-side capacitor electrode 234 of the resonator capacitor C2 to define the second-stage LC resonator Q2.

The structure of the third-stage LC resonator Q3 will now be described.

A resonator capacitor C3 includes the resonator capacitor electrode 332 and the ground-side capacitor electrode 134 that opposes the resonator capacitor electrode 332. The inductor via electrodes 354 to 357 are connected to each other to define a columnar inductor L31, and the inductor via electrodes 358 to 360 are connected to each other to define a columnar inductor L32.

The inductor via electrode 357, which is at one end of the columnar inductor L31, and the inductor via electrode 358, which is at one end of the columnar inductor L32, are connected to both ends of the line electrode 333 to define a loop resonator inductor L3. The inductor via electrode 354, which is at the other end of the columnar inductor L31, is connected to the resonator capacitor electrode 332 of the resonator capacitor C3 and the inductor via electrode 360, which is at the other end of the columnar inductor L32, is connected to the ground-side capacitor electrode 134 of the resonator capacitor C3 to define the third-stage LC resonator Q3.

The connection via electrodes 351 and 352 are connected to each other to define a columnar output electrode G14. The connection via electrode 353, which is at one end of the columnar output electrode G14, is connected to the resonator capacitor electrode 332 and the connection via electrode 351, which is at the other end of the columnar output electrode G14, is connected to the output electrode 331.

The resonator capacitor electrodes 133 and 332 oppose the jump-coupling capacitor electrode 132 to define a jump-coupling capacitor Cs1 for jump-coupling between the LC resonators Q1 and Q3. The line electrodes 136 and 333 oppose the adjacent coupling capacitor electrode 135 with the dielectric layer 117 sandwiched therebetween to define coupling capacitors Cs2 and Cs3.

The connection via electrodes 251 to 254 are connected to each other to define a columnar ground electrode G12 and the connection via electrodes 255 to 258 are connected to each other to define a columnar ground electrode G13.

The ground-side capacitor electrode 134 is connected to the connection via electrode 254, which is at one end of the columnar ground electrode G12, and the connection via electrode 255, which is at one end of the columnar ground electrode G13. The ground electrode 231 is connected to the connection via electrode 251, which is at the other end of the columnar ground electrode G12, and the connection via electrode 258, which is at the other end of the columnar ground electrode G13. The LC resonators Q1 and Q3 are grounded via the columnar ground electrodes G12 and G13.

As shown in FIG. 1, the band-pass filter 100 in which the dielectric layers 111 to 120 are stacked is a multilayer body including the dielectric layers stacked therein. The multilayer body includes four side surfaces and two main surfaces including one main surface and the other main surface. Among the four side surfaces of the multilayer body, the ground terminals 2 and 3 are provided on the long side surfaces. The ground electrode 231 provided on the dielectric layer 111 and the extensions of the ground-side capacitor electrode 234 provided on the dielectric layer 119, shown in FIG. 2, are connected to the ground terminals 2 and 3. The input electrode 131, the output electrode 331, and the ground electrode 231 are exposed on the other main surface of the multilayer body.

Electromagnetic field coupling occurs between the LC resonators Q1 and Q2 and between the LC resonators Q2 and Q3 in the above manner. The electrical equivalent circuit of the three LC resonators Q1, Q2, and Q3 in the multilayer body, which includes the jump-coupling capacitor Cs1 and the coupling capacitors Cs2 and Cs3, is shown in FIG. 3.

Figure 4A:
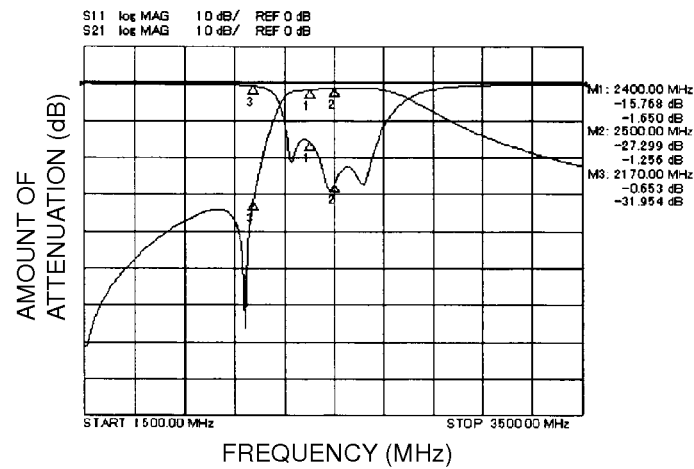
FIG. 4A shows frequency characteristics of a band-pass filter according to a first Comparative example.
Figure 4B:
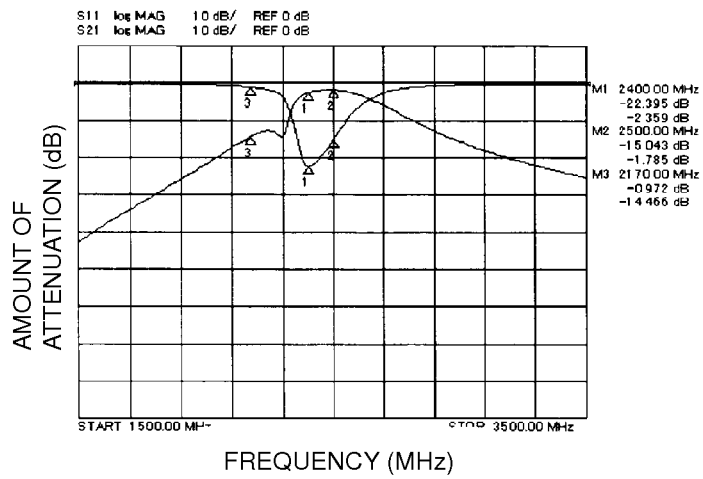
FIG. 4B shows frequency characteristics of a band-pass filter according to a second Comparative example.
Figure 4C:
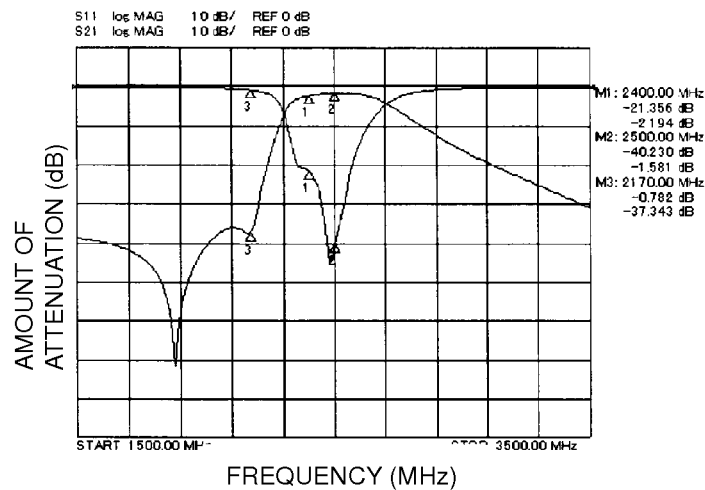
FIG. 4C shows frequency characteristics of the band-pass filter according to the first preferred embodiment of the present invention.

FIG. 4A shows frequency characteristics of a band-pass filter according to a first Comparative example, FIG. 4B shows frequency characteristics of a band-pass filter according to a second Comparative example, and FIG. 4C shows frequency characteristics of the band-pass filter according to the first preferred embodiment.

Figure 13:
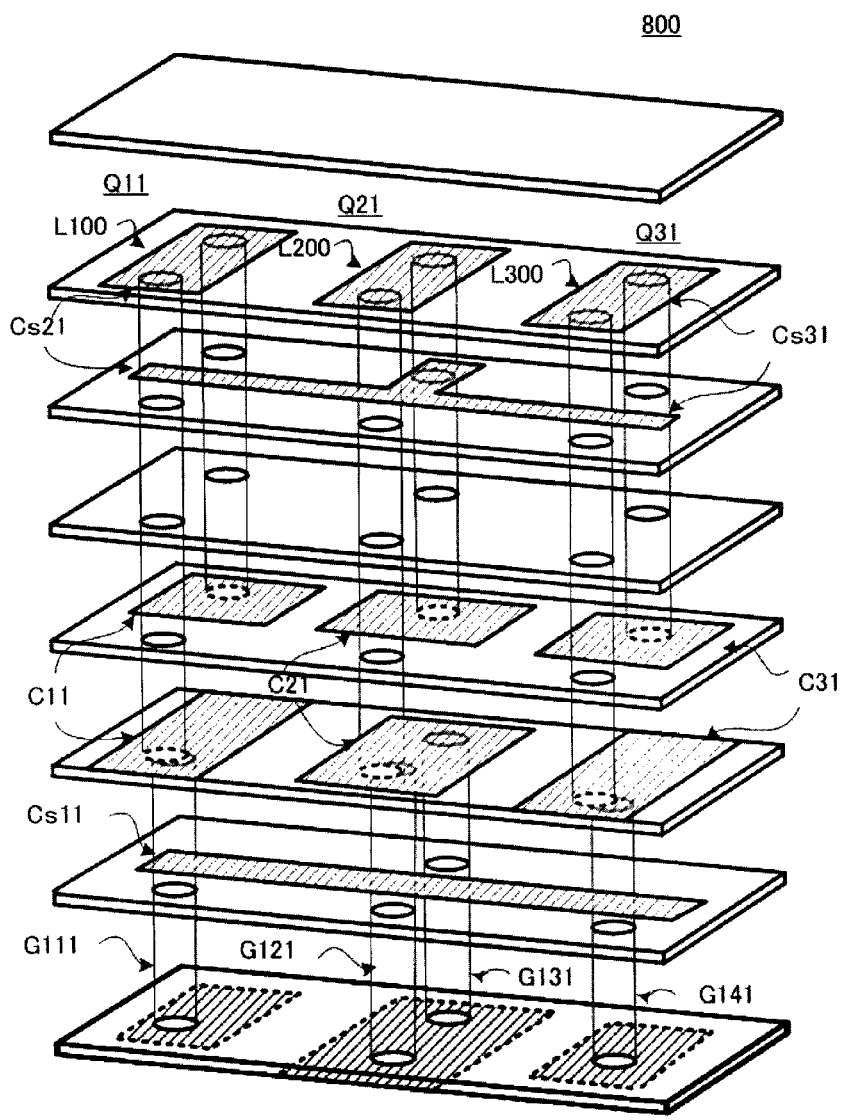
FIG. 13 shows the first Comparative example of the band-pass filter according to the first preferred embodiment of the present invention.

FIG. 13 is an exploded perspective view of a multilayer body 800 of the band-pass filter according to the first Comparative example.

The band-pass filter including the multilayer body in FIG. 13 is a multilayer band-pass filter having the same electrical equivalent circuit as that in the first preferred embodiment in FIG. 3. The first Comparative example differs from the first preferred embodiment in that LC resonators Q11, Q21, and Q31 are grounded at the side of the other main surface in the stacking direction of the multilayer body and no electrode that functions as a shield is provided at the side of one main surface in the stacking direction of the multilayer body. In the first preferred embodiment, the resonator capacitor electrode of the second-stage LC resonator is grounded at the side of one main surface in the stacking direction of the multilayer body.

Figure 14:
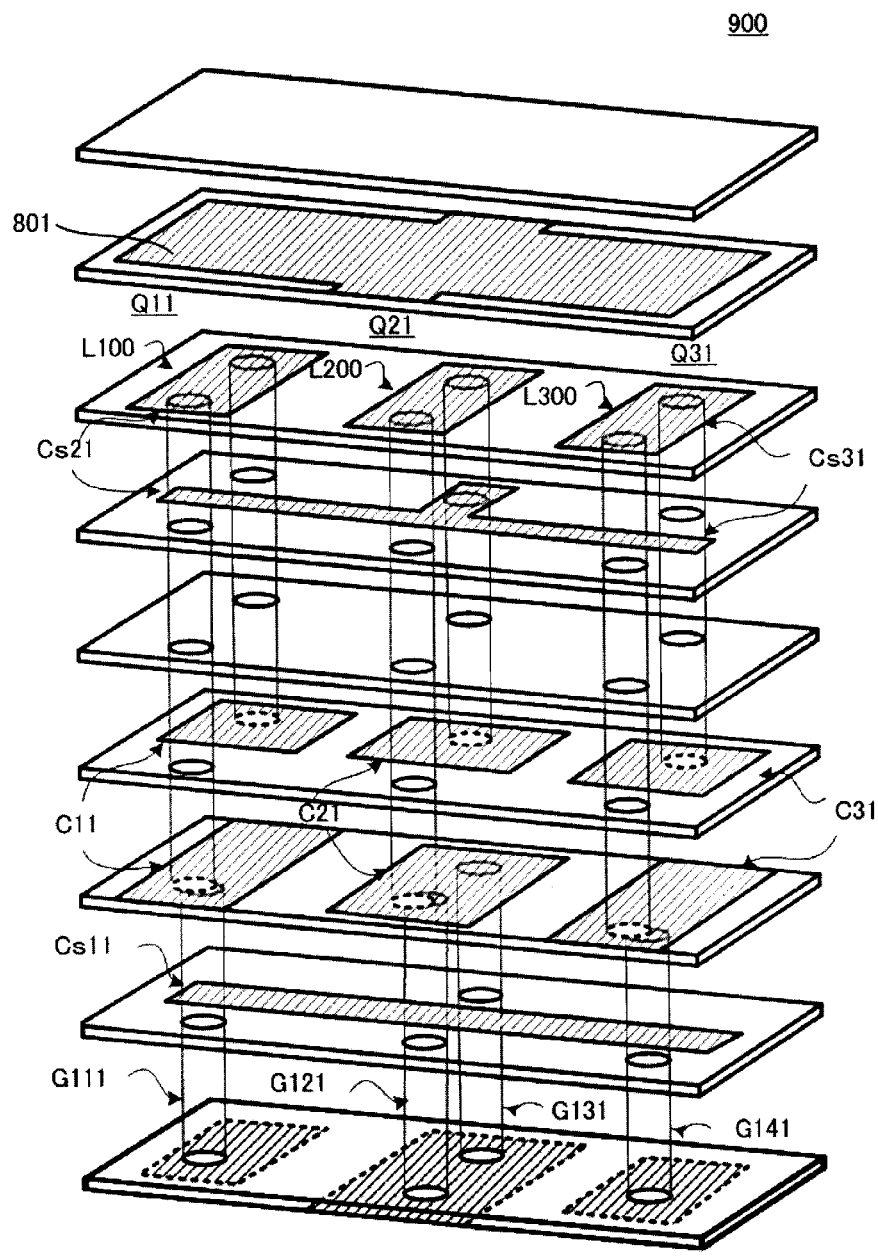
FIG. 14 shows the second Comparative example of the band-pass filter according to the first preferred embodiment of the present invention.

In the band-pass filter according to the second Comparative example, a shield electrode 801 is provided on one main surface in the stacking direction of the multilayer body 800 shown in FIG. 13 in order to cut noise from another electronic component. FIG. 14 is an exploded perspective view of a multilayer body 900 of the band-pass filter according to the second Comparative example. Since the external perspective views of the first and second Comparative examples are the same as the external perspective view of the first preferred embodiment shown in FIG. 1, they are not shown here. The ground terminals 2 and 3 outside the multilayer body are omitted in FIG. 13 and FIG. 14.

FIG. 4A shows the frequency characteristics (transmission characteristic S21 and reflection characteristic S11) of the band-pass filter of the first Comparative example shown in FIG. 13. The characteristics shown in FIG. 4A are desirable as the frequency characteristics. However, since the band-pass filter of the first Comparative example does include any shield electrode therein, the band-pass filter can be affected by external noise.

FIG. 4B shows the frequency characteristics (transmission characteristic S21 and reflection characteristic S11) of the band-pass filter of the second Comparative example shown in FIG. 14, in which the shield electrode is provided in the band-pass filter of the first Comparative example in order to cut the external noise. The pass band in FIG. 4B is lower than half of that of the first Comparative example. It is not possible to achieve a sufficient amount of attenuation because the amount of attenuation of the attenuation pole toward lower frequencies is decreased.

FIG. 4C shows the frequency characteristics (transmission characteristic S21 and reflection characteristic S11) of the band-pass filter of the first preferred embodiment. The ground-side capacitor electrode 234 of the second-stage LC resonator Q2 is provided so as to offer the shield function. The pass band in the first preferred embodiment is widened, compared with the second Comparative example in which the shield electrode is provided in the same or substantially the same manner. The amount of attenuation near the attenuation pole toward lower frequencies is maintained sufficiently small.

In addition, in the first preferred embodiment, the ground-side capacitor electrode 134 is provided in the stacking direction between the second-stage LC resonator Q2 and the jump-coupling capacitor electrode 132. Accordingly, an occurrence of a parasitic capacitance between the jump-coupling capacitor electrode 132 and the line electrode 232 or the resonator capacitor electrode 233 of the second-stage LC resonator Q2 is prevented or minimized.

As described above, with the structure of the band-pass filter of the first preferred embodiment, it is possible to provide a compact band-pass filter that is much less affected by external noise and that has excellent frequency characteristics. While the first preferred embodiment is described in detail, it will be clear that the present invention is not limited to the specific examples and preferred embodiments described above and that many changes and modified preferred embodiments will be apparent to those skilled in the art without departing from the spirit and scope of the invention.

Second Preferred Embodiment

Figure 5:
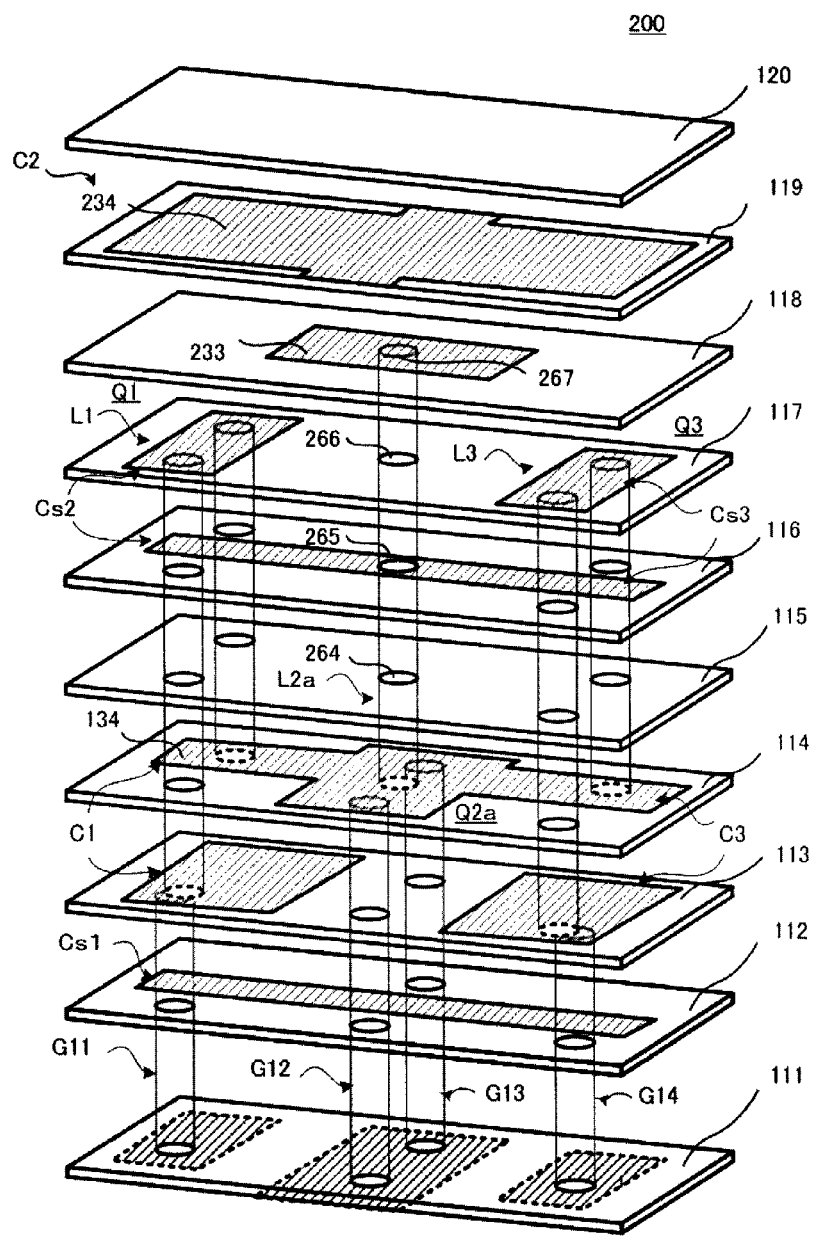
FIG. 5 is an exploded perspective view of a band-pass filter according to a second preferred embodiment of the present invention.

FIG. 5 is an exploded perspective view of a band-pass filter 200 according to a second preferred embodiment of the present invention. Since the external perspective view of the band-pass filter 200 is the same or substantially the same as the external perspective view of the first preferred embodiment shown in FIG. 1, it is not shown. The ground terminals 2 and 3 outside the multilayer body are omitted in FIG. 5.

Referring to FIG. 5, the band-pass filter 200 of the second preferred embodiment preferably includes three-stage LC resonators, as in the first preferred embodiment.

The second preferred embodiment differs from the first preferred embodiment in that the inductor of the second-stage LC resonator includes a via inductor, instead of the loop inductor including the via inductors and the line electrode. The remaining structure of the second preferred embodiment is preferably the same or substantially the same as that of the first preferred embodiment.

The structure of the second-stage LC resonator in the second preferred embodiment, which is the difference from the first preferred embodiment, will now be described with reference to FIG. 5.

In the second preferred embodiment, inductor via electrodes 264, 265, 266, and 267 are connected to each other to define one via inductor L2a.

The resonator capacitor C2 includes the resonator capacitor electrode 233 and the ground-side capacitor electrode 234.

The via electrode 264, which is at one end of the via inductor L2a, is connected to the ground-side capacitor electrode 134 of the first-stage and third-stage LC resonators and the via electrode 267, which is at the other end of the via inductor L2a, is connected to the resonator capacitor electrode 233 of the resonator capacitor C2 to define an LC resonator Q2a.

According to the second preferred embodiment, since no line electrode is included in the via inductor L2a of the second-stage LC resonator, it is possible to provide a band-pass filter having a high Q factor.

Third Preferred Embodiment

Figure 6:
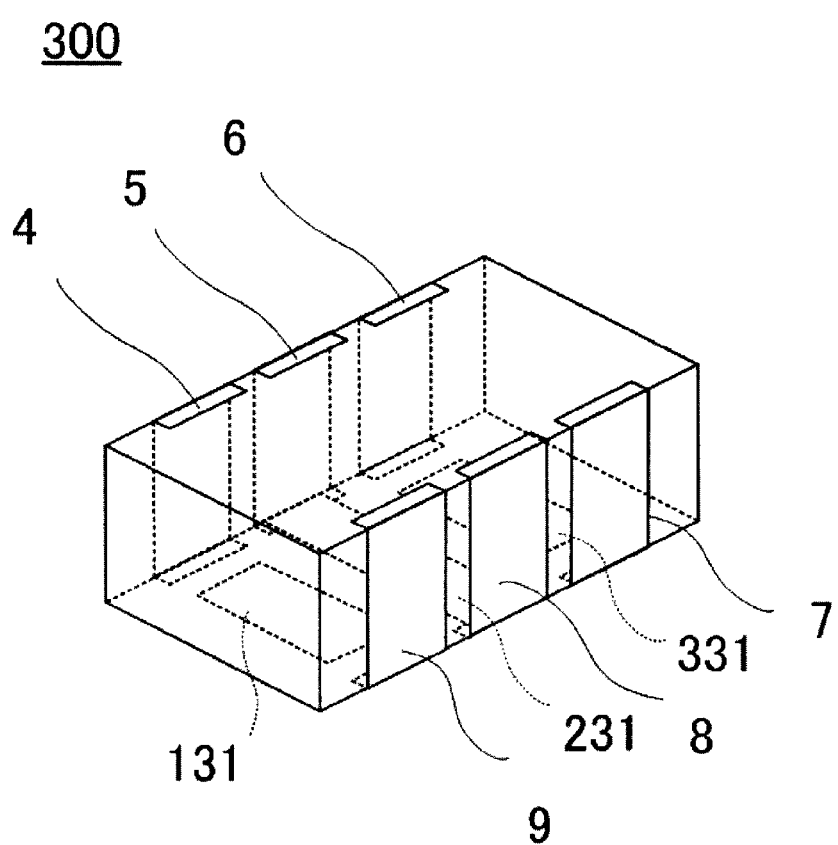
FIG. 6 is an external perspective view of a band-pass filter according to a third preferred embodiment of the present invention.
Figure 7:
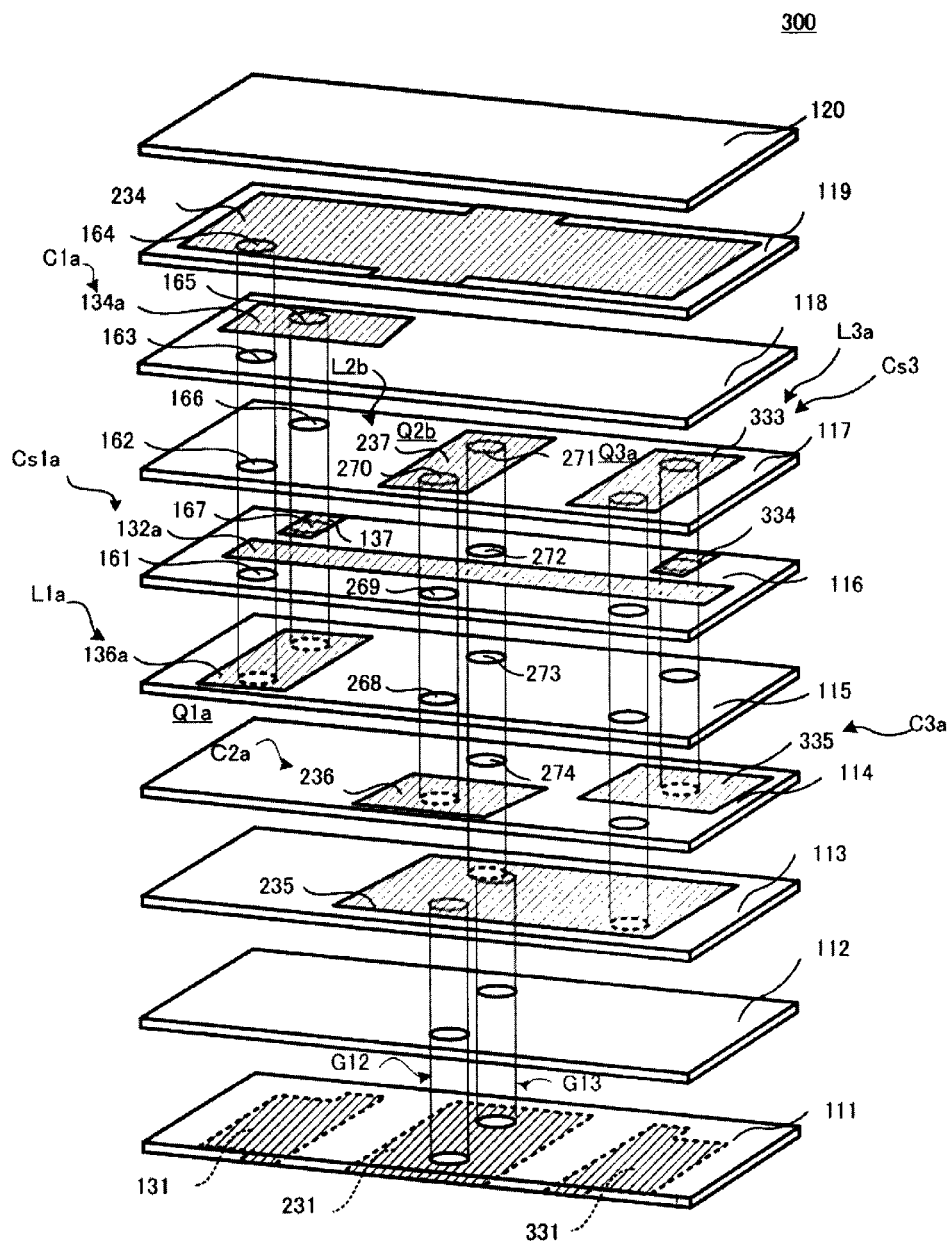
FIG. 7 is an exploded perspective view of the band-pass filter according to the third preferred embodiment of the present invention.

FIG. 6 and FIG. 7 show a band-pass filter 300 according to a third preferred embodiment of the present invention. FIG. 6 is an external perspective view of the band-pass filter 300. FIG. 7 is an exploded perspective view of the band-pass filter 300. Input and output terminals 4, 6, 7, and 9 and ground terminals 5 and 8, which are provided outside the multilayer body, are omitted in FIG. 7.

Referring to FIG. 7, the band-pass filter 300 of the third preferred embodiment preferably includes three-stage LC resonators, as in the first preferred embodiment.

The third preferred embodiment differs from the first preferred embodiment in that the resonator capacitor of the first-stage LC resonator is arranged on one main surface of the multilayer body. The resonator capacitor of the second-stage LC resonator is arranged on one main surface of the multilayer body in the first preferred embodiment. In the band-pass filter 300 of the third preferred embodiment, input and output electrodes are separately provided and the input and output terminals are provided outside the multilayer body.

A first-stage LC resonator Q1a includes an inductor L1a and a resonator capacitor C1a. The inductor L1a includes inductor via electrodes 161, 162, 163, 164, 165, 166, and 167 provided in dielectric layers 115, 116, 117, 118, and 119 and a line electrode 136a. The resonator capacitor C1a includes a resonator capacitor electrode 134a and the ground-side capacitor electrode 234.

A second-stage LC resonator Q2b includes an inductor L2b and a resonator capacitor C2a. The inductor L2b includes inductor via electrodes 268, 269, 270, 271, 272, 273, and 274 provided in dielectric layers 114, 115, 116, and 117 and a line electrode 237. The resonator capacitor C2a includes the resonator capacitor electrodes 235 and 236.

A third-stage LC resonator Q3a includes a loop inductor L3a, as in the first preferred embodiment, and a resonator capacitor C3a. The resonator capacitor C3a includes a resonator capacitor electrode 335 and the ground-side capacitor electrode 235.

A jump-coupling capacitor electrode 132a is provided on the dielectric layer 116.

In the LC resonators Q1a, Q2b, and Q3a having the above configuration, the electromagnetic field coupling occurs between the LC resonators Q1a and Q2b and between the LC resonators Q2b and Q3a. The LC resonator Q1a is coupled to the LC resonator Q3a via the jump-coupling capacitor electrode 132a.

As shown in FIG. 6, among the four side surfaces of the multilayer body, the input terminals 4 and 9, the output terminals 6 and 7, and the ground terminals 5 and 8 are preferably arranged along the long side surfaces.

The input terminals 4 and 9 are connected to an extension of the input electrode 131 provided on the rear surface of the dielectric layer 111 and an input electrode 137. The output terminals 6 and 7 are connected to an extension of the output electrode 331 and an output electrode 334. The ground terminals 5 and 8 are connected to the ground electrode 231 provided on the dielectric layer 111 shown in FIG. 7 and extensions of the ground-side capacitor electrode 234 provided on the dielectric layer 119.

As described above, with the structure in which the resonator capacitor in the first-stage LC resonator is arranged at the side of one main surface of the multilayer body, it is possible to obtain the compact band-pass filter which is less affected by external noise and in which unnecessary electromagnetic field coupling does not occur.

Fourth Preferred Embodiment

Figure 8:
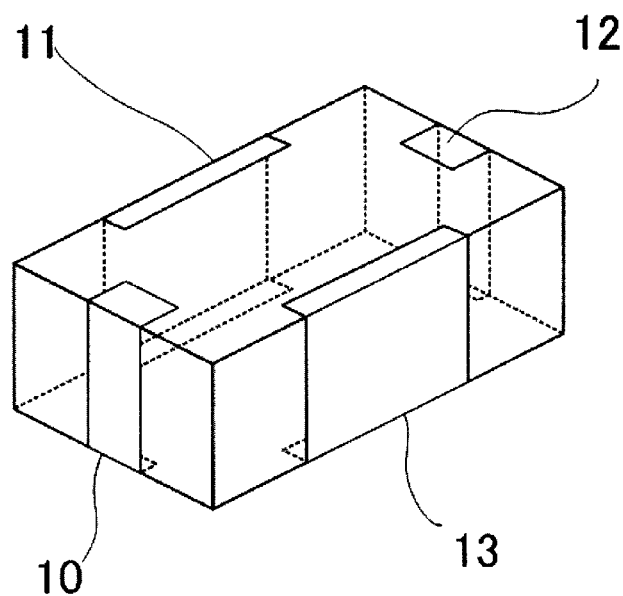
FIG. 8 is an external perspective view of a band-pass filter according to a fourth preferred embodiment of the present invention.
Figure 9:
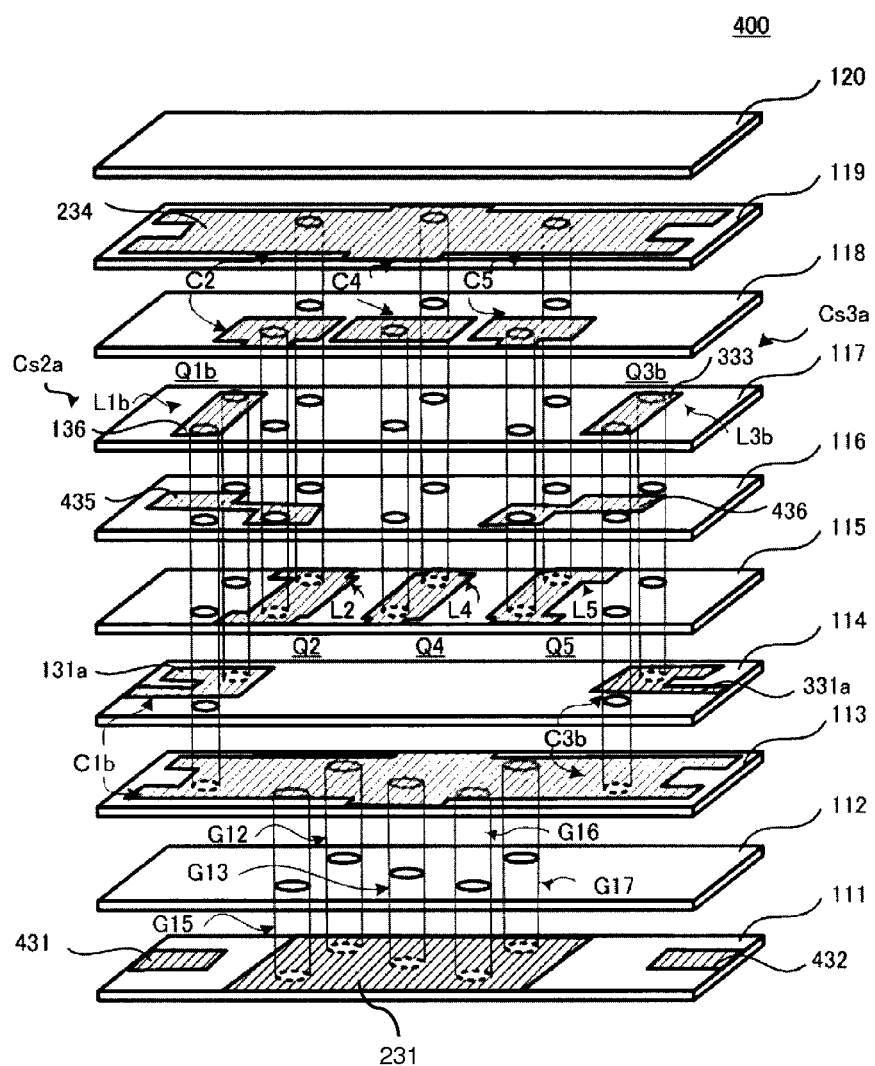
FIG. 9 is an exploded perspective view of the band-pass filter according to the fourth preferred embodiment of the present invention.

FIG. 8 and FIG. 9 show a band-pass filter 400 according to a fourth preferred embodiment of the present invention. FIG. 8 is an external perspective view of the band-pass filter 400. FIG. 9 is an exploded perspective view of the band-pass filter 400. Input and output terminals 10 and 12 and ground terminals 11 and 13, which are provided outside the multilayer body, are omitted in FIG. 9.

Referring to FIG. 9, the band-pass filter 400 of the fourth preferred embodiment preferably includes five-stage LC resonators.

The fourth preferred embodiment differs from the first preferred embodiment in that the band-pass filter of the fourth preferred embodiment includes five LC resonators. The band-pass filter includes the three LC resonators in the first preferred embodiment.

The band-pass filter 400 of the fourth preferred embodiment has a configuration in which, among the five-stage LC resonators, resonator capacitors C2, C4, and C5 of the second-stage to four-stage LC resonators are arranged at the side of one main surface of a multilayer body 400a and resonator capacitor C1b and C3b of the remaining first-stage and fifth-stage LC resonators are arranged at the side of the other main surface of the multilayer body 400a.

Input and output electrodes 131a and 331a of the band-pass filter 400 of the fourth preferred embodiment are provided at the sides of the short sides of the dielectric layer 114.

An input electrode 431 and an output electrode 432 are provided on the dielectric layer 111.

Coupling capacitor electrodes 435 and 436 are provided on the dielectric layer 116. The coupling capacitor electrode 435 is electrically connected to the loop inductor L2 and opposes the line electrode 136 of an inductor L1b. The coupling capacitor electrode 436 is electrically connected to an inductor L5 and opposes the line electrode 333 of a loop inductor L3b.

As shown in FIG. 8, among the four side surfaces of the multilayer body 400a, the ground terminals 11 and 13 are provided on the long side surfaces and the input and output terminals 10 and 12 are provided on the short side surfaces. The ground terminals 11 and 13 are connected to the ground electrode 231 provided on the dielectric layer 111 and extensions of the ground-side capacitor electrode 234 provided on the dielectric layer 119, as shown in FIG. 9.

As described above, the five-stage LC resonators enable a band-pass filter having a sharper pass band to be obtained.

Fifth Preferred Embodiment

Figure 10:
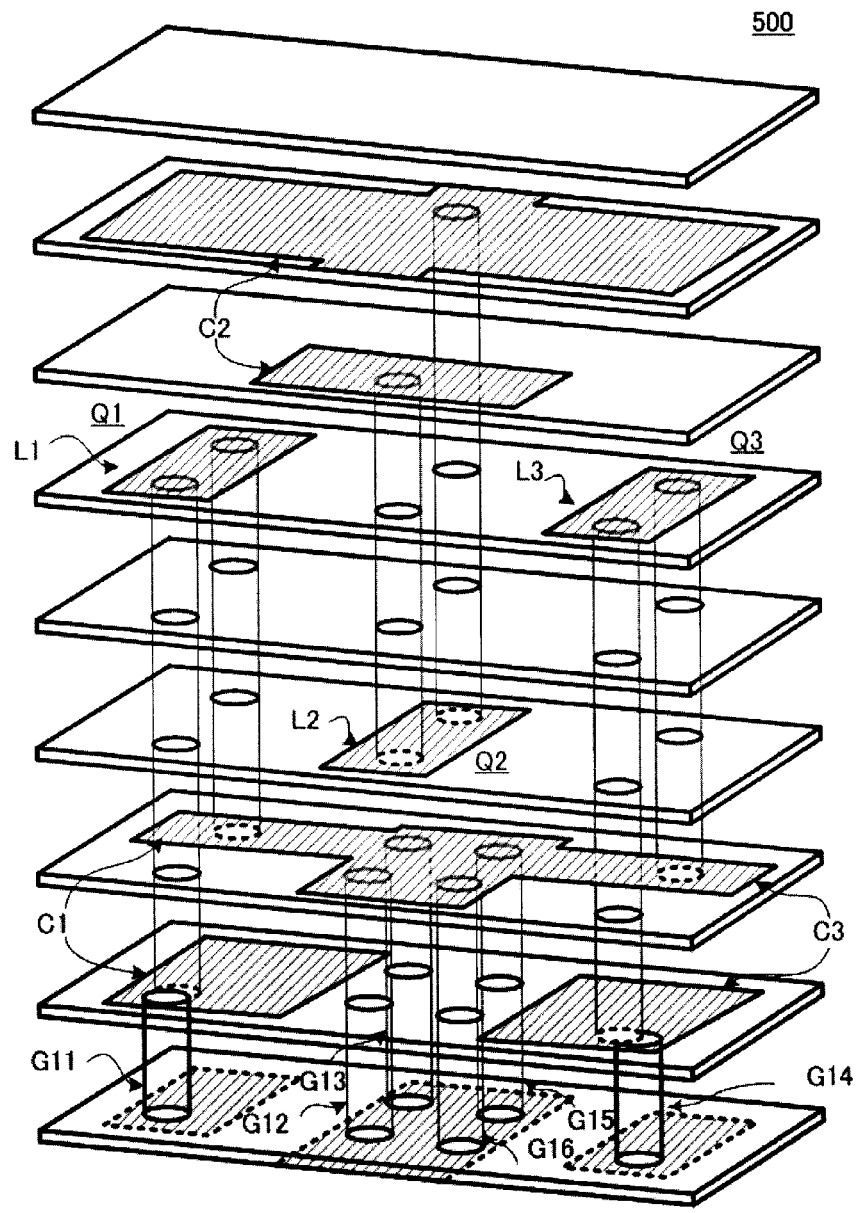
FIG. 10 is an exploded perspective view of a multilayer body of a band-pass filter according to a fifth preferred embodiment of the present invention.

FIG. 10 is an exploded perspective view of a multilayer body 500 of a band-pass filter according to a fifth preferred embodiment of the present invention. Since the external perspective view of the multilayer body 500 is the same or substantially the same as the external perspective view of the first preferred embodiment shown in FIG. 1, it is not shown here. The ground terminals 2 and 3 outside the multilayer body 500 are omitted in FIG. 10.

Referring to FIG. 10, the band-pass filter of the fifth preferred embodiment preferably includes three-stage LC resonators.

The fifth preferred embodiment differs from the first preferred embodiment in that the jump-coupling between the first-stage LC resonator and the third-stage LC resonator does not occur. The remaining structure of the fifth preferred embodiment is preferably the same or substantially the same as that of the first preferred embodiment.

It is possible to obtain a band-pass filter having desired frequency characteristics with no coupling capacitor, as in the fifth preferred embodiment.

Sixth Preferred Embodiment

Figure 11:
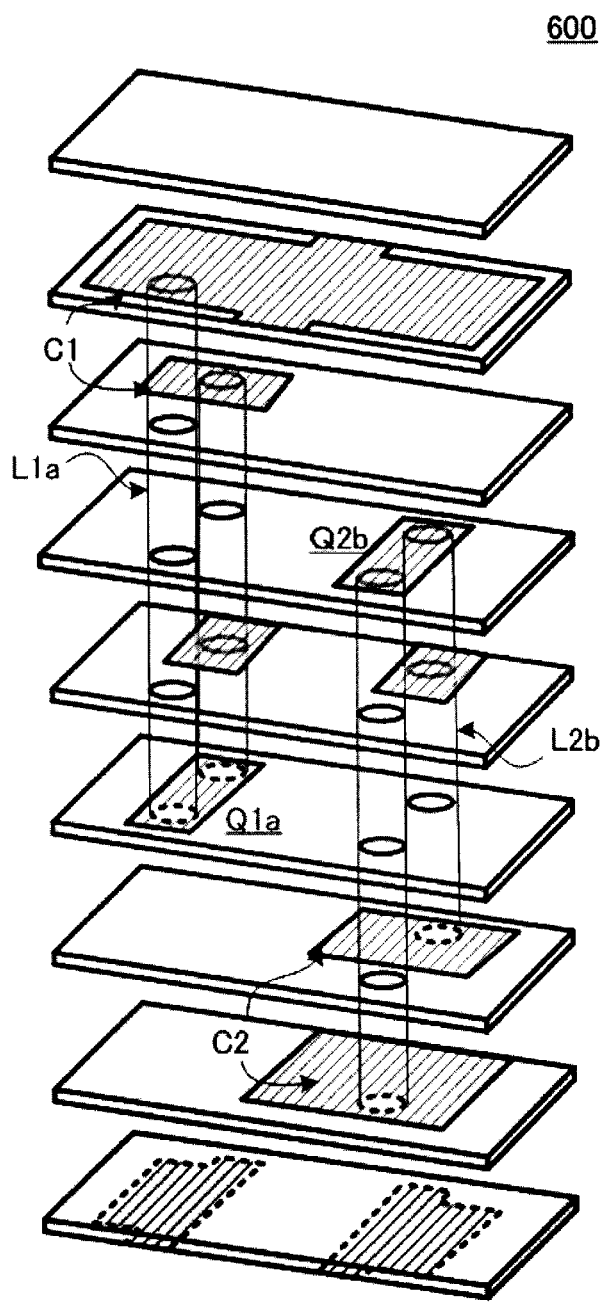
FIG. 11 is an exploded perspective view of a multilayer body of a band-pass filter according to a sixth preferred embodiment of the present invention.
Figure 12:
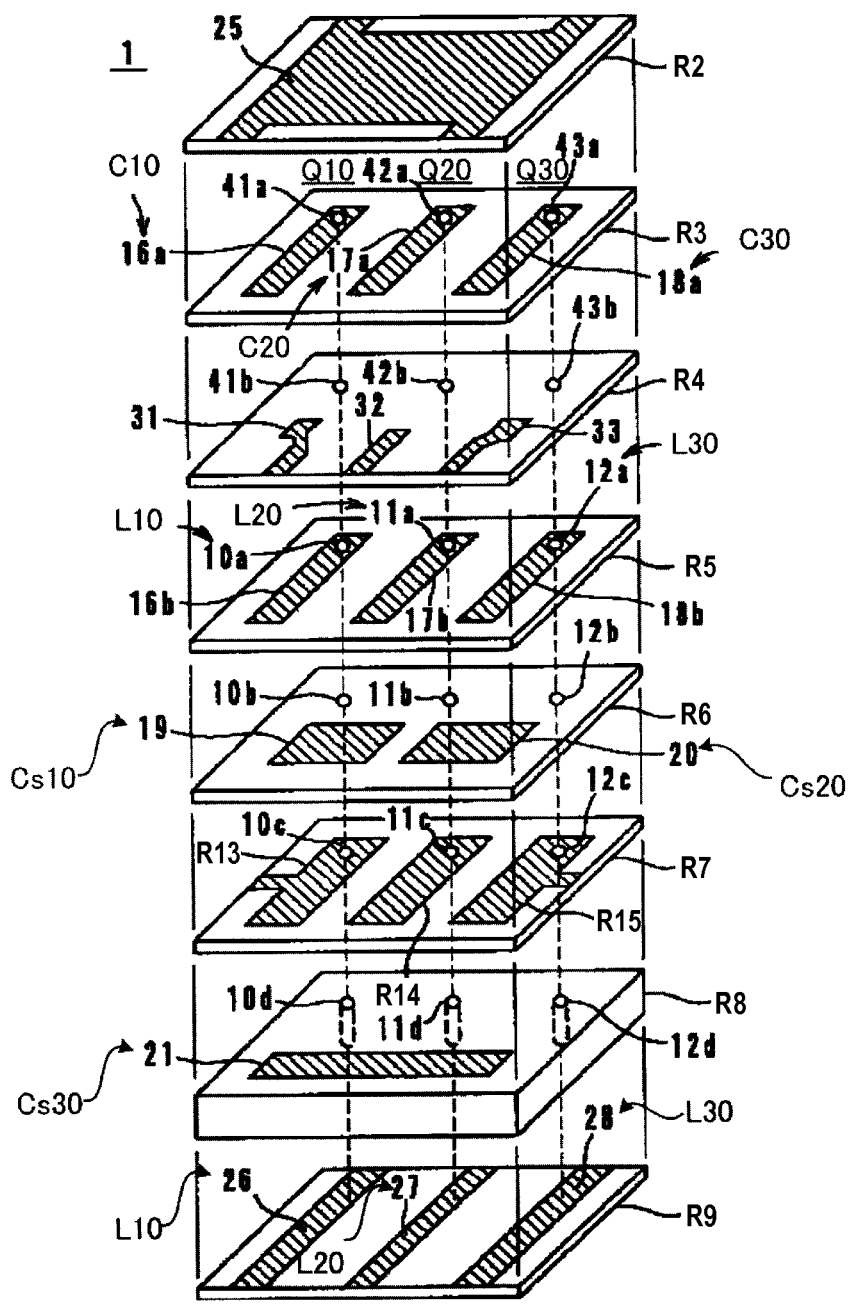
FIG. 12 is an exploded perspective view of a multilayer LC composite component in Japanese Unexamined Patent Application Publication No. 2002-76807.

FIG. 11 is an exploded perspective view of a multilayer body 600 of a band-pass filter according to a sixth preferred embodiment of the present invention. The external perspective view of the multilayer body 600 is the same or substantially the same as that of the third preferred embodiment. The input terminals 4 and 9, the output terminals 6 and 7, and the ground terminals 5 and 8 outside the multilayer body 600 are omitted in FIG. 11.

Referring to FIG. 11, the band-pass filter of the sixth preferred embodiment preferably includes the two-stage LC resonators Q1a and Q2b. The structure of the LC resonators Q1a and Q2b is preferably the same or substantially the same as that in the third preferred embodiment.

The present invention is applicable to the band-pass filter including the two-stage LC resonators, as in the sixth preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band-pass filter comprising:
a multilayer body including a plurality of dielectric layers that are stacked on each other, capacitor electrodes and line electrodes provided on the plurality of dielectric layers, and via inductors including a plurality of via electrodes that are connected to each other and that penetrate through the plurality of dielectric layers; wherein
a plurality of LC resonators are arranged in a direction perpendicular or substantially perpendicular to a stacking direction of the multilayer body;
each of the plurality of LC resonators includes an inductor including one of the via inductors being connected to a capacitor including a pair of the capacitor electrodes;
in each of the plurality of LC resonators, one end of the respective inductor is connected to one of the pair of capacitor electrodes of the respective capacitor;
one of the pair of capacitor electrodes of at least one of the plurality of LC resonators is arranged at a side of one main surface in the stacking direction of the multilayer body and the capacitors of remaining ones of the plurality of LC resonators are arranged at a side of another main surface in the stacking direction of the multilayer body;
the other of the pair of capacitor electrodes of the at least one of the plurality of LC resonators is grounded;
a first one of the plurality of LC resonators includes an input terminal and a second one of the plurality of LC resonators includes an output terminal;
a third one of the plurality of LC resonators next to the first one of the plurality of LC resonators is the at least one of the plurality of LC resonators;
both of the first one of the plurality of LC resonators and the second one of the plurality of LC resonators includes one of the line electrodes;
both ends of the line electrodes of the first one and the second one of the plurality of LC resonators are electrically connected to respective ones of the via inductors to define a loop inductor;
a coupling electrode is arranged so as to oppose the line electrodes of the first one and the second one of the plurality of LC resonators; and
the coupling electrode is connected to the inductor of the third one of the plurality of LC resonators adjacent to the first one of the plurality of LC resonators and the second one of the plurality of LC resonators.

2. The band-pass filter according to claim 1, wherein the other of the pair of capacitor electrodes that is grounded is arranged so as to cover at least the plurality of LC resonators, as viewed from the stacking direction of the multilayer body.

3. The band-pass filter according to claim 1, wherein the coupling electrode is arranged so as to oppose the line electrode of the first one of the plurality of LC resonators and the line electrode of the second one of the plurality of LC resonators.

4. The band-pass filter according to claim 1, wherein the third one of the plurality of LC resonators includes one of the line electrodes the inductor of each of the plurality of LC resonators includes the respective line electrode and a pair of the via inductors, and one end of one of the pair of via inductors and one end of the other of the pair of via inductors are respectively connected to one end and another end of the corresponding line electrode to define the loop inductor.

5. The band-pass filter according to claim 1, wherein the inductor of the at least one of the plurality of LC resonators is defined by at least one of the via inductors.

* * * * *